(12) United States Patent
Park

(10) Patent No.: US 8,164,105 B2
(45) Date of Patent: Apr. 24, 2012

(54) LIGHT EMITTING DEVICE AND METHOD FOR FABRICATING THE SAME

(75) Inventor: Hyung Jo Park, Gwangju-Si (KR)

(73) Assignee: LG Innotek Co., Ltd., Seoul (KR)

( * ) Notice: Subject to any disclaimer, the term of this patent is extended or adjusted under 35 U.S.C. 154(b) by 469 days.

(21) Appl. No.: 12/522,823

(22) PCT Filed: Apr. 1, 2008

(86) PCT No.: PCT/KR2008/001828
§ 371 (c)(1),
(2), (4) Date: Jul. 10, 2009

(87) PCT Pub. No.: WO2008/120947
PCT Pub. Date: Oct. 9, 2008

(65) Prior Publication Data
US 2010/0038672 A1      Feb. 18, 2010

(30) Foreign Application Priority Data
Apr. 2, 2007  (KR) .................. 10-2007-0032550

(51) Int. Cl.
*H01L 33/00* (2010.01)
*H01L 33/20* (2010.01)
*H01L 33/36* (2010.01)
*H01L 21/00* (2006.01)

(52) U.S. Cl. ............... 257/94; 257/99; 257/E33.006; 257/E33.048; 257/E33.062; 257/E33.065; 257/E31.095; 438/39; 438/47

(58) Field of Classification Search ............ 257/94, 257/99, E33.006, E33.048, E33.062, E33.065, 257/E31.095; 438/39, 47
See application file for complete search history.

(56) References Cited

U.S. PATENT DOCUMENTS

| | | | |
|---|---|---|---|
| 7,173,288 B2 | 2/2007 | Lee et al. | |
| 7,365,371 B2 * | 4/2008 | Andrews | 257/99 |
| 7,525,248 B1 * | 4/2009 | Fan | 313/512 |
| 7,576,367 B2 * | 8/2009 | Sugimori | 257/99 |
| 7,821,023 B2 * | 10/2010 | Yuan et al. | 257/98 |
| 7,834,375 B2 * | 11/2010 | Andrews | 257/100 |
| 7,964,888 B2 * | 6/2011 | Loh et al. | 257/99 |
| 2007/0030611 A1 | 2/2007 | Cho et al. | |

FOREIGN PATENT DOCUMENTS

| KR | 10-2006-0062715 A | 6/2006 |
| WO | WO-2005/124880 A1 | 12/2005 |

* cited by examiner

*Primary Examiner* — Evan Pert
(74) *Attorney, Agent, or Firm* — Birch, Stewart, Kolasch & Birch, LLP

(57) ABSTRACT

Disclosed is a light emitting device. The light emitting device comprises a first conductive semiconductor layer, an active layer on the first conductive semiconductor layer, a second conductive semiconductor layer on the active layer, the second conductive semiconductor layer comprising a first area and a second area, a third conductive semiconductor layer on the second area of the second conductive semiconductor layer, a first electrode layer electrically connecting the first conductive semiconductor layer with the second conductive semiconductor layer of the second area, and a second electrode layer electrically connecting the second conductive semiconductor layer with the third conductive semiconductor layer.

20 Claims, 3 Drawing Sheets

[Fig. 1]
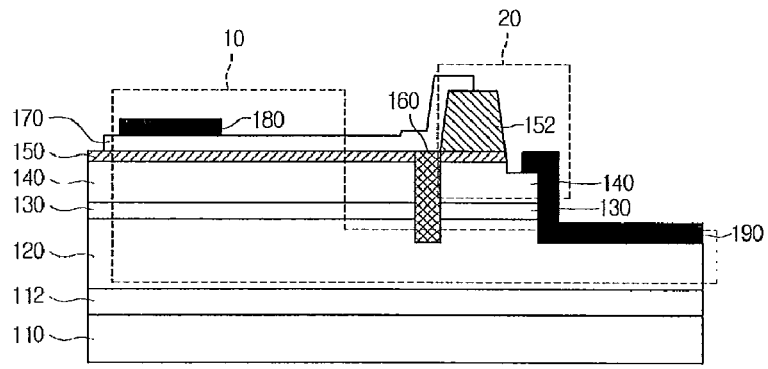
[Fig. 2]
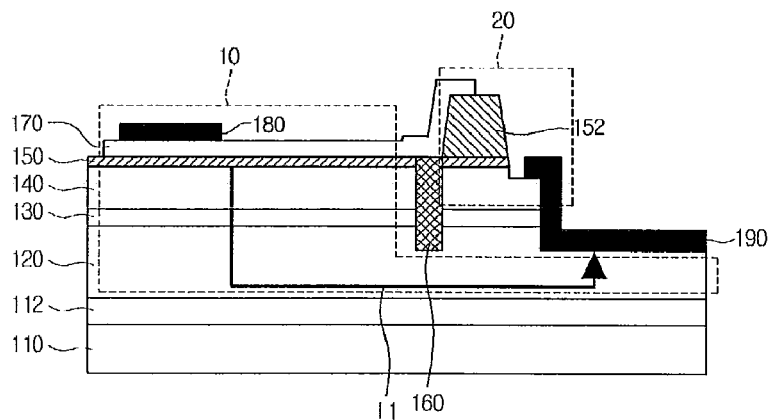
[Fig. 3]
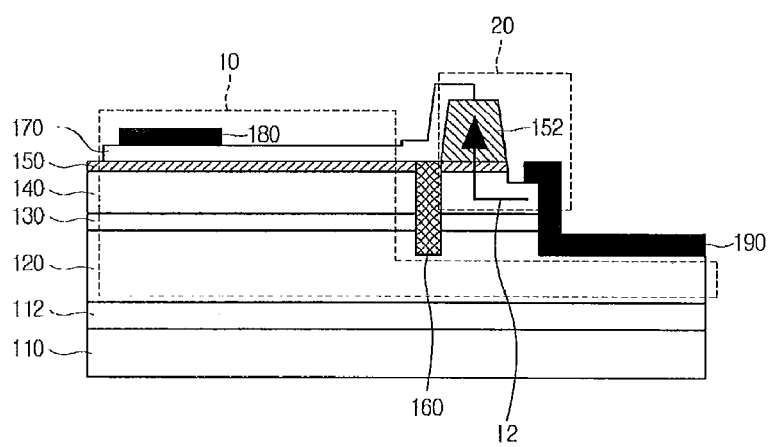
[Fig. 4]
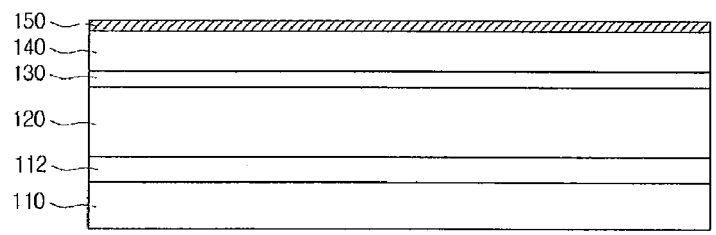

[Fig. 5]
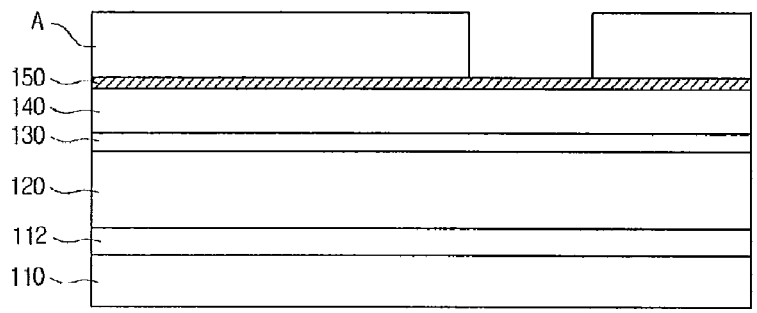
[Fig. 6]
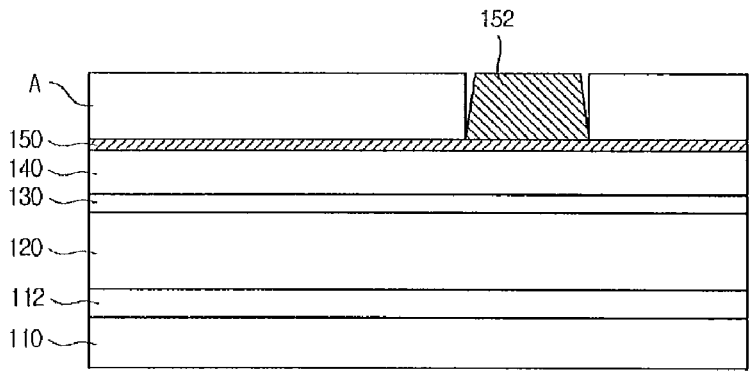
[Fig. 7]
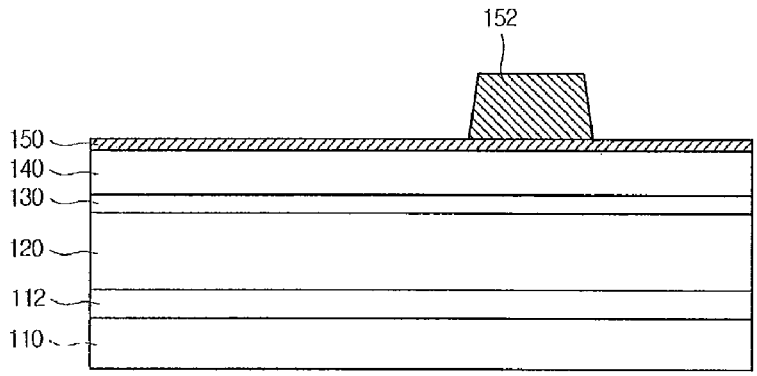
[Fig. 8]
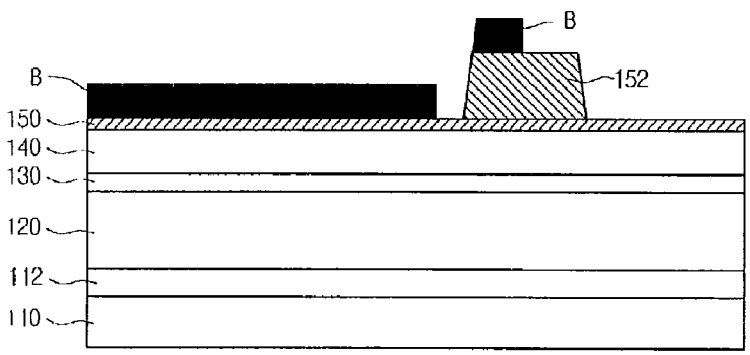

[Fig. 9]
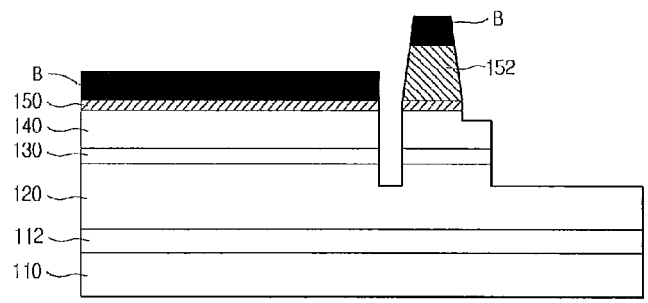
[Fig. 10]
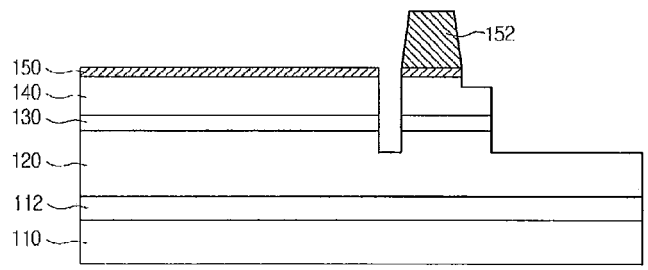
[Fig. 11]
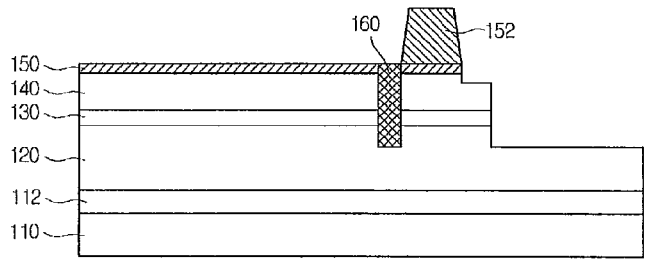
[Fig. 12]
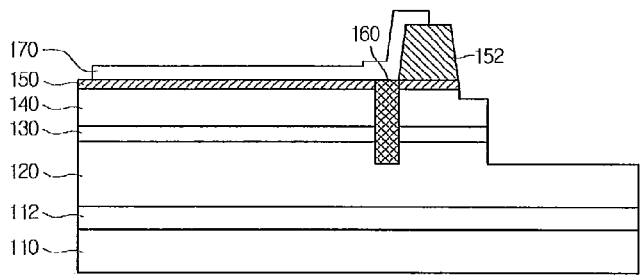
[Fig. 13]
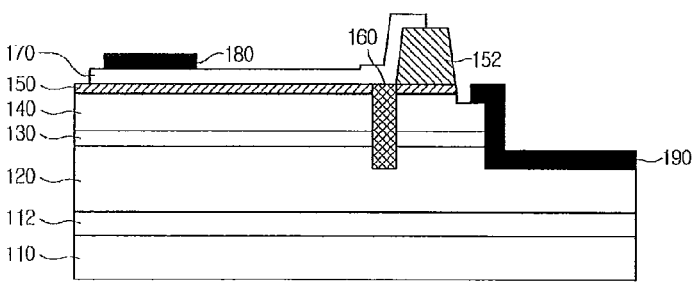

LIGHT EMITTING DEVICE AND METHOD FOR FABRICATING THE SAME

TECHNICAL FIELD

The embodiment relates to a light emitting device and a method for fabricating the same.

BACKGROUND ART

Recently, research into an apparatus that uses an LED (light emitting device) as a light emitting device has been actively conducted.

The LED converts an electric signal into an optical signal using the characteristics of a compound semiconductor. The LED comprises a first conductive semiconductor layer, an active layer and a second conductive semiconductor layer which are stacked on a substrate. As the LED is powered on, the active layer emits light.

The first conductive semiconductor layer may be an N type semiconductor layer and the second conductive semiconductor layer may be a P type semiconductor layer, and vice versa.

Since the LED may be broken by backward bias or ESD (electrostatic discharge) current, a device for protecting the LED from the backward bias or ESD current is mounted at the LED in the package process of the LED.

For example, a Zener diode is properly aligned to prevent the LED from being broken by the backward bias or ESD current.

However, since the size of an LED package has become reduced, mounting the Zener diode in the LED package may be difficult and the cost required for the package process may be increased.

DISCLOSURE OF INVENTION

Technical Problem

The embodiment provides a light emitting device and a method for fabricating the same.

The embodiment provides a light emitting device that comprises a protective device and an LED, and a method for fabricating the same.

The embodiment provides a light emitting device, in which a protective device and an LED are highly integrated, and a method for fabricating the same.

Technical Solution

According to an embodiment, a light emitting device comprises: a first conductive semiconductor layer; an active layer on the first conductive semiconductor layer; a second conductive semiconductor layer on the active layer, the second conductive semiconductor layer comprising a first area and a second area; a third conductive semiconductor layer on the second area of the second conductive semiconductor layer; a first electrode layer electrically connecting the first conductive semiconductor layer with the second conductive semiconductor layer of the second area; and a second electrode layer electrically connecting the second conductive semiconductor layer with the third conductive semiconductor layer.

According to an embodiment, a light emitting device comprises: a substrate; an LED area comprising a first conductive semiconductor layer, the active layer and a second conductive semiconductor layer on a first area of the substrate; and a protective device area comprising the second conductive semiconductor layer and a third conductive semiconductor layer on a second area of the substrate.

According to an embodiment, a method for fabricating a light emitting device comprises: forming a first conductive semiconductor layer, an active layer and a second conductive semiconductor layer; forming a third conductive semiconductor layer on at least a part of the second conductive semiconductor layer; and selectively etching the first conductive semiconductor layer, the active layer and the second conductive semiconductor layer through an etch process and forming an insulating layer in the etched portion, thereby dividing into a first area comprising the first conductive semiconductor layer, the active layer and the second conductive semiconductor layer, and a second area comprising the second and third conductive semi-conductor layers.

Advantageous Effects

The embodiment can provide a light emitting device and a method for fabricating the same.

The embodiment can provide a light emitting device that comprises a protective device and an LED, and a method for fabricating the same.

The embodiment can provide a light emitting device, in which a protective device and an LED are highly integrated, and a method for fabricating the same.

BRIEF DESCRIPTION OF THE DRAWINGS

FIG. 1 is a sectional view showing the structure of a light emitting device according to an embodiment;

FIGS. 2 and 3 are sectional views illustrating an operation of a light emitting device according to an embodiment; and FIGS. 4 to 13 are sectional views illustrating a method for fabricating a light emitting device according to one embodiment.

MODE FOR THE INVENTION

Hereinafter, a light emitting device and a method for fabricating the same according to an embodiment will be described with reference to accompanying drawings. The following embodiments are for illustrative purposes only. The scope of the claims of the present invention is not limited thereto.

In the description of an embodiment, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present.

Further, the thickness or size of layers shown in the drawings can be simplified or exaggerated for the purpose of clear explanation. In addition, the size of each element may be reduced or magnified from the real size thereof.

FIG. 1 is a sectional view showing the structure of a light emitting device according to the embodiment.

Referring to FIG. 1, the light emitting device according to the embodiment comprises a substrate 110, a buffer layer 112, a first conductive semiconductor layer 120, an active layer 130, a second conductive semiconductor layer 140, a barrier layer 150, an ohmic electrode layer 170, a first electrode layer 190, a second electrode layer 180, an insulating layer 160 and a third conductive semiconductor layer 152.

The light emitting device according to the embodiment can be divided into an LED area 10 and a protective device area 20 by the insulating layer 160. In FIG. 1, the layers aligned at the left side of the insulating layer 160 are suitable for performing the function of an LED for generating light, and the layers aligned at the right side of the insulating layer 160 are suitable for performing the function of an ESD protective device.

In detail, as forward bias is applied to the first and second electrode layers 190 and 180, the LED area 10, which comprises the first conductive semiconductor layer 120, the active layer 130 and the second conductive semiconductor layer 140, performs an LED function of emitting light from the active layer 130 by combination of electrons and holes.

Further, as backward bias is applied to the first and second electrode layers 190 and 180, the protective device area 20, which comprises the second and third conductive semiconductor layers 140 and 152, performs a function of the ESD protective device by providing a path through which electric current flows.

The first electrode layer 190 is electrically connected with the first conductive semi-conductor layer 120 of the LED area 10 and the second conductive semiconductor layer 140 of the protective device area 20. The second electrode layer 180 is electrically connected with the second conductive semiconductor layer 140 of the LED area 10 and the third conductive semiconductor layer 152 of the protective device area 20 through the ohmic electrode layer 170.

The light emitting device according to one embodiment comprises the layers, which perform the function of the LED, and the layers, which performs the function of the protective device, on one substrate 110. Further, the light emitting device according to one embodiment comprises the layers, which perform the function of the LED, and the layers, which performs the function of the protective device, on one buffer layer 112. Furthermore, the light emitting device according to one embodiment comprises the layers, which performs the function of the protective device, on the first conductive semiconductor layer 120.

According to the light emitting device of the embodiment, the LED and the protective device can be formed in a small area, the manufacturing process can be simplified by fabricating the LED together with the protective device. In addition, electrical connection between the LED and the protective device can be simply achieved, and the package process can be easily performed.

According to the light emitting device according to one embodiment, some layers of the LED area 10, which perform the function of the LED, are electrically isolated from some layers of the protective device area 20, which perform the function of the protective device, by the insulating layer 160. Some layers of the LED area 10 and the protective device area 20 have sides making contact with the insulating layer 160, and conductive layers are aligned above and below the insulating layer 160. For example, the ohmic electrode layer 170 is aligned above the insulating layer 160 and the first conductive semiconductor layer 120 is aligned below the insulating layer 160.

As described above, the light emitting device is divided into the LED area 10 and the protective device area 20 by the insulating layer 160, so that layers of the LED area 10 and the protective device area 20, i.e. the LED and the protective device, can be formed in a small area. Further, a process is added to the LED manufacturing process, so that the LED can be formed together with the protective device.

The first conductive semiconductor layer 120, the active layer 130 and the second conductive semiconductor layer 140 are vertically aligned in at least a part of the LED area 10, and the second and third conductive semiconductor layers 140 and 152 are vertically aligned in at least a part of the protective device area 20.

Meanwhile, for example, the substrate 110 can comprise at least one selected from the group consisting of $Al_2O_3$, Si, SiC, GaAs, ZnO and MgO.

The buffer layer 112 reduces the difference between a lattice constant of the substrate 110 and a lattice constant of the nitride semiconductor layer laminated on the substrate 110. For example, the buffer layer 112 can have a stack structure such as AlInN/GaN, $In_xGa_{1-x}N$/GaN or $Al_xIn_yGa_{1-x-y}N$/$In_xGa_{1-x}N$/GaN. Further, an undoped GaN layer may also be formed between the buffer layer 112 and the first conductive semiconductor layer 120.

The first conductive semiconductor layer 120 can comprise a nitride semiconductor layer containing first conductive impurities. For example, the first conductive impurities can comprise N type impurities.

The active layer 130 can have a single quantum or multi-quantum well structure. For example, the active layer 130 can have a stack structure of an InGaN well layer and a GaN barrier layer.

The second conductive semiconductor layer 140 can comprise a nitride semi-conductor layer containing second conductive impurities. For example, the second conductive impurities can comprise P type impurities.

When voltage of more than predetermined voltage is applied to the light emitting device, the barrier layer 150 allows electric current to flow through tunneling phenomenon. The barrier layer 150 may be selectively formed. According to another embodiment, the second conductive semiconductor layer 140 may directly make contact with the ohmic electrode layer 170. For example, the barrier layer 150 can comprise an InGaN layer or the first conductive semiconductor layer, and have a thin thickness of 10 Å to 30 Å.

The ohmic electrode layer 170 can comprise a transparent electrode layer. For example, the ohmic electrode layer 170 can comprise at least one of ITO, ZnO, RuOx, TiOx or IrOx.

The insulating layer 160 comprises insulating material. For example, the insulating layer 160 can comprise an oxide layer. At least a part of the insulating layer 160 is surrounded by the first conductive semiconductor layer 120. The insulating layer 160 makes contact with the active layer 130 and the second conductive semiconductor layer 140.

The third conductive semiconductor layer 152 can comprise a nitride semiconductor layer containing third conductive impurities. The third conductive semiconductor layer 152 can comprise the same impurities as those of the first conductive semiconductor layer 120. For example, the third conductive impurities can comprise N type impurities, and the third conductive semiconductor layer 152 can comprise an InGaN layer. The third conductive semiconductor layer 152 can have a thickness of 1000 Å to 3000 Å. The third conductive semiconductor layer 152 can make contact with the insulating layer 160.

The first and second electrode layers 190 and 180, for example, can comprise at least one of Ti, Cr, Ni, Al, Pt or Au.

FIGS. 2 and 3 are sectional views illustrating an operation of the light emitting device according to the embodiment.

Referring to FIG. 2, if forward bias is applied to the light emitting device according to the embodiment, electric current flows in the first direction I1 through the LED area 10. At this time, the electric current does not flow through the protective device area 20. Thus, light is emitted from the active layer 130 of the LED area 10, so that the LED normally operates.

Referring to FIG. 3, if backward bias is applied to the light emitting device according to the embodiment due to an ESD and the like, electric current flows in the second direction I2 through the protective device area 20. At this time, the electric current does not flow through the LED area 10. Thus, the backward bias is applied to the LED area 10, so that the LED can be prevented from being broken.

FIGS. 4 to 13 are sectional views illustrating a method for fabricating the light emitting device according to one embodiment.

Referring to FIG. 4, the buffer layer 112, the first conductive semiconductor layer 120, the active layer 130, the second conductive semiconductor layer 140 and the barrier layer 150 are sequentially formed on the substrate 110.

The substrate 110 can comprise at least one selected from the group consisting of $Al_2O_3$, Si, SiC, GaAs, ZnO and MgO.

The buffer layer 112 can be grown in a chamber, in which the substrate 110 is located, by providing TMGa and TMIn of $3\times10^5$ mole per minute and TMAl of $3\times10^6$ mole per minute into the chamber together with hydrogen gas and ammonia gas.

An undoped GaN layer can be formed between the buffer layer 112 and the first conductive semiconductor layer 120.

The first conductive semiconductor layer 120 can be formed on the buffer layer 112 by providing $SiH_4$ containing N type impurities such as Si, $NH_3$ ($3.7\times10^{-2}$ mole/minute) and TMGa($1.2\times10^{-4}$ mole/minute).

The active layer 130 can be grown on the first conductive semiconductor layer 120 in the nitrogen atmosphere while providing TMGa and TMIn through a MOCVD (metal organic chemical vapor deposition) method.

The second conductive semiconductor layer 140 can be grown on the active layer 130 by providing TMGa($7\times10^{-6}$ mole/minute), TMAl($2.6\times10^{-5}$ mole/minute), (EtCp2Mg) $\{Mg(C_2H_5C_5H_4)s\}$($5.2\times10^{-7}$ mole/minute) and $NH_3$ ($2.2\times10^{-7}$ mole/minute) by using hydrogen as carrier gas.

The barrier layer 150 can be formed on the second conductive semiconductor layer 140 by providing $NH_3$, TMGa and $SiH_4$ containing N type impurities such as Si.

Referring to FIG. 5, a first mask layer A is formed on the barrier layer 150. The first mask layer A can be formed in the form of a $SiO_2$ thin film using $SiH_4$ and $O_2$. Then, a part of the first mask layer A is selectively removed through a photolithography process to expose a part of the barrier layer 150.

Referring to FIG. 6, the third conductive semiconductor layer 152 is formed on the exposed barrier layer 150. The third conductive semiconductor layer 152, for example, comprises an InGaN layer as a semiconductor layer containing N type impurities.

Referring to FIG. 7, after forming the third conductive semiconductor layer 152, the first mask layer A is removed.

Referring to FIGS. 8 to 10, a second mask layer B is selectively formed on the barrier layer 150 and the third conductive semiconductor layer 152. Next, the first conductive semiconductor layer 120, the active layer 130, the second conductive semiconductor layer 140, the barrier layer 150 and the third conductive semiconductor layer 152 are selectively removed through an etch process by using the second mask layer B as a mask. Then, the second mask layer B is removed.

Referring to FIG. 11, the insulating layer 160 is selectively formed in a part of an area which is formed through the etch process. The active layer 130, the second conductive semiconductor layer 140, the barrier layer 150 and the third conductive semiconductor layer 152 are electrically isolated by the insulating layer 160.

Referring to FIG. 12, the ohmic electrode layer 170 is formed on the barrier layer 150, the insulating layer 160 and the third conductive semiconductor layer 152.

Referring to FIG. 13, the first electrode layer 190 is formed, which is electrically connected with the first conductive semiconductor layer 120, the active layer 130 and the second conductive semiconductor layer 140. Then, the second electrode layer 180 is formed on the ohmic electrode layer 170.

Accordingly, the light emitting device according to the embodiment can be fabricated. The method for fabricating the light emitting device according to the embodiment as described above is illustrative purpose only, and the scope of the present invention is not limited thereto.

Although embodiments have been described with reference to a number of illustrative embodiments thereof, it should be understood that numerous other modifications and embodiments can be devised by those skilled in the art that will fall within the spirit and scope of the principles of this disclosure.

INDUSTRIAL APPLICABILITY

The embodiments can be applied to light emitting devices.

The invention claimed is:

1. A light emitting device comprising:
a first conductive semiconductor layer;
an active layer on the first conductive semiconductor layer;
a second conductive semiconductor layer on the active layer, the second conductive semiconductor layer comprising a first area and a second area;
a third conductive semiconductor layer on the second area of the second conductive semiconductor layer;
a first electrode layer electrically connecting the first conductive semiconductor layer with the second conductive semiconductor layer of the second area; and
a second electrode layer electrically connecting the second conductive semi-conductor layer with the third conductive semiconductor layer.

2. The light emitting device as claimed in claim 1, comprising an insulating layer that electrically isolates the second conductive semiconductor layer of the second area from the second conductive semiconductor layer of the first area.

3. The light emitting device as claimed in claim 1, comprising an ohmic electrode layer on the second and third conductive semiconductor layers, wherein the ohmic electrode layer is electrically connected with the second electrode layer.

4. The light emitting device as claimed in claim 3, comprising a barrier layer formed between the second conductive semiconductor layer and the ohmic electrode layer.

5. The light emitting device as claimed in claim 4, wherein the barrier layer comprises first conductive impurities.

6. The light emitting device as claimed in claim 1, comprising a protective device comprising the second conductive semiconductor layer of the second area and the third conductive semiconductor layer.

7. The light emitting device as claimed in claim 2, wherein a part of the insulating layer is surrounded by the first conductive semiconductor layer.

8. A light emitting device comprising:
a substrate;
an LED area comprising a first conductive semiconductor layer, an active layer and a second conductive semiconductor layer on a first area of the substrate; and
a protective device area comprising the second conductive semiconductor layer and a third conductive semiconductor layer on a second area of the substrate.

9. The light emitting device as claimed in claim 8, comprising an insulating layer that isolates the LED area from the protective device area.

10. The light emitting device as claimed in claim 8, wherein the LED area and the protective device area are formed on one substrate.

11. The light emitting device as claimed in claim 8, comprising a buffer layer formed between the substrate and the LED area and between the substrate and the protective device area, wherein the LED area and the protective device area are formed on one buffer layer.

12. The light emitting device as claimed in claim 8, wherein the protective device area is formed on the first conductive semiconductor layer of the LED area.

13. The light emitting device as claimed in claim 8, comprising:
- a first electrode layer electrically connected with the first conductive semi-conductor layer of the LED area and the second conductive semiconductor layer of the protective device area; and
- a second electrode layer electrically connected with the second conductive semi-conductor layer of the LED area and the third conductive semiconductor layer of the protective device area.

14. The light emitting device as claimed in claim 8, comprising a barrier layer on the second conductive semiconductor layer of the LED area.

15. The light emitting device as claimed in claim 8, wherein the first and third conductive semiconductor layers comprise N type impurities and the second conductive semiconductor layer comprises P type impurities.

16. A method for fabricating a light emitting device, the method comprising:

forming a first conductive semiconductor layer, an active layer and a second conductive semiconductor layer;

forming a third conductive semiconductor layer on at least a part of the second conductive semiconductor layer; and selectively etching the first conductive semiconductor layer, the active layer and the second conductive semiconductor layer through an etch process and forming an insulating layer in an etched portion, thereby dividing into a first area comprising the first conductive semiconductor layer, the active layer and the second conductive semiconductor layer, and a second area comprising the second and third conductive semiconductor layers.

17. The method as claimed in claim 16, comprising:
electrically connecting the first conductive semiconductor layer with the second conductive semiconductor layer of the second area; and
electrically connecting the second conductive semiconductor layer of the first area with the third conductive semiconductor layer.

18. The method as claimed in claim 16, wherein a part of the third conductive semi-conductor layer on the second conductive semiconductor layer is etched through the etch process.

19. The method as claimed in claim 16, wherein the insulating layer makes contact with the first conductive semiconductor layer, the active layer and the second conductive semiconductor layer.

20. The method as claimed in claim 16, wherein the step of forming the first conductive semiconductor layer, the active layer and the second conductive semiconductor layer is performed on one substrate.

* * * * *